United States Patent [19]

Held et al.

[11] Patent Number: 5,039,588

[45] Date of Patent: Aug. 13, 1991

[54] NON-ELECTROSCOPIC PROLONGED TACK TONERS

[75] Inventors: Robert P. Held, Englishtown; Howard Matrick, Highlands, both of N.J.

[73] Assignee: E. I. du Pont de Nemours and Company, Wilmington, Del.

[21] Appl. No.: 422,361

[22] Filed: Oct. 16, 1989

[51] Int. Cl.$^5$ .......................... G03G 9/00; G03G 9/08
[52] U.S. Cl. .................................. 430/110; 430/120; 430/109
[58] Field of Search ...................... 430/110, 106.6, 120

[56] References Cited

U.S. PATENT DOCUMENTS

| | | |
|---|---|---|
| 2,462,029 | 2/1949 | Perry . |
| 2,608,543 | 8/1952 | Wiswell . |
| 2,613,191 | 10/1952 | McGaffin et al. . |
| 2,678,284 | 5/1954 | Holt . |
| 3,080,250 | 3/1963 | Claus . |
| 3,260,612 | 7/1966 | Dulmage et al. . |
| 3,427,275 | 2/1969 | Davis et al. ......................... 260/31.8 |
| 3,447,954 | 6/1969 | Lohse . |
| 3,464,353 | 9/1969 | Bach et al. . |
| 3,515,570 | 6/1970 | Suzuki . |
| 3,669,922 | 6/1972 | Bartsch et al. . |
| 3,762,944 | 10/1973 | Sloan et al. . |
| 3,980,576 | 9/1976 | Vijayendran . |
| 4,303,698 | 12/1981 | Beske et al. . |
| 4,355,055 | 10/1982 | Beske et al. . |
| 4,359,516 | 11/1982 | Nacci et al. ....................... 430/106.6 |
| 4,455,360 | 6/1984 | Ishikawa et al. . |
| 4,461,823 | 7/1984 | Held . |
| 4,469,625 | 9/1984 | Held . |
| 4,477,547 | 10/1984 | Yamada et al. . |
| 4,489,153 | 12/1984 | Ashcraft et al. . |
| 4,520,088 | 5/1985 | Senga et al. . |
| 4,572,885 | 2/1986 | Sato et al. ......................... 430/108 X |
| 4,599,294 | 7/1986 | Matsumoto et al. . |
| 4,608,329 | 8/1986 | Geisler . |
| 4,613,559 | 9/1986 | Ober et al. . |
| 4,656,114 | 4/1987 | Cederberg et al. . |
| 4,666,817 | 5/1987 | Sachi . |
| 4,683,191 | 7/1987 | Geisler . |

FOREIGN PATENT DOCUMENTS

| | | |
|---|---|---|
| 0060122 | 9/1982 | European Pat. Off. . |
| 0064397 | 11/1982 | European Pat. Off. . |
| 0186307 | 7/1986 | European Pat. Off. . |

*Primary Examiner*—Marion E. McCamish
*Assistant Examiner*—S. Crossan

[57] ABSTRACT

This invention relates to non-electroscopic prolonged tack toners for transferring toned images to an image receptor at low temperatures in the range from 20° C. to 70° C.

20 Claims, No Drawings

NON-ELECTROSCOPIC PROLONGED TACK TONERS

FIELD OF THE INVENTION

This invention relates to prolonged tack toners and, more particularly, to non-electroscopic prolonged tack toners for transferring toned images to image receptors at low temperatures.

BACKGROUND OF THE INVENTION

Prolonged tack materials prepared from thermoplastic resins in a plasticizer are known which on heating become tacky or sticky and retain this tackiness for a considerable time even after cooling. This property, also known as delayed tack or setting, has been found useful in the preparation of adhesive compositions, as well as in thermography to produce a master which is imagewise exposed by means of heat, toned, and the toned image is then transferred onto an image receptor to provide a copy of the original image. In the above-described process, the prolonged tack property is present in the form of a continuous film over an imagewise tacky element. Conventional prolonged tack toners are used to develop the tacky image areas.

However, a subsequent transfer of the toned image using these toners onto an image receptor, does not result in a sufficient transfer of the toned image to an image receptor at low temperatures such as room temperature.

U.S. Pat. No. 4,461,823, issued to Held on July 24, 1984, describes multiple transfer of tacky image areas using prolonged tack toners wherein the toners can be prepared by combining a thermoplastic resin, e.g., polystyrene, with a plasticizer or a copolymer of methylmethacrylate (90)/methacrylic acid (10) and triphenyl phosphate plasticizer. A dye or colored pigment can be combined with the resin/plasticizer component. One of the main disadvantages with these toners is that it is difficult to transfer a sufficient amount of toner to an image receptor at a low temperature.

U.S. Pat. No. 4,469,625, issued to Held on Sept. 4, 1984, describes prolonged tack toners for the preparation of electric circuits. Examples of organic polymers and plasticizers are described in column 1 and include polystyrene and N-cyclohexyl-p-toluenesulfonamide, poly(methylmethacrylate)(90)/methacrylic acid(10) and triphenyl phosphate.

SUMMARY OF THE INVENTION

This invention relates to a non-electroscopic prolonged tack toner comprising:

(i) an organic, thermoplastic terpolymer consisting of substantially equal percentages by weight of styrene, alpha-methyl styrene and an acid selected from the group consisting of acrylic acid and methacrylic acid, said terpolymer having an average molecular weight in the range from 1,000 to 20,000 said terpolymer being present in an amount of 10% to 70% by weight based on the total toner weight; and (ii) a solid plasticizer which is present in an amount from 30% to 90% by weight based on the total toner weight; wherein said toner is suitable for transferring toned images at low temperatures to an image receptor.

This invention also concerns processes using these toners.

DETAILED DESCRIPTION OF THE INVENTION

The term "prolonged tack toners" means toners that are nontacky at normal room temperatures but upon heating to an elevated temperature become and remain tacky for a period of time even though the temperature of the toner returns or is returned to a temperature below the temperature at which the toner becomes tacky, including room temperature. Such toners are sometimes referred to as delayed tack toners.

The term "non-electroscopic" means that the toners are neither repelled from nor attracted to a charged rod when placed in close proximity to the particles.

This invention will be further illustrated using the particular case of a latent tacky image. Such image comprises tacky toner-receptive areas and nontacky background areas. Suitable films comprise a support with a photosensitive layer which are capable of forming imagewise tacky and non-tacky images on their surface, either directly, e.g., by exposure to actinic radiation, or by treatment with solutions, heat, or other means. Preferably the tacky images are formed in photosensitive layers which can be comprised of positive-working or negative-working compositions. Suitable positive-working compositions are photohardenable, e.g., photopolymerizable compositions disclosed, for example, in Chu and Cohen U.S. Pat. No. 3,649,268 and suitable negative-working compositions are disclosed for example, in Abele and Grossa U.S. Pat. No. 4,243,741 and Cohen and Fan U.S. Pat. No. 4,174,216.

The terms "photopolymerizable" and "photohardenable" as used herein refer to systems in which the molecular weight of at least one component of the photosensitive layer is increased by exposure to actinic radiation sufficiently to result in a change in the rheological and thermal behavior of the exposed areas.

One of the problems with conventional toners is that it is very difficult to transfer the toned image to an image receptor at a low temperature. Usually, transfers effected at low temperatures using conventional toners have been inferior.

The toners of this invention can be made readily as described in Example 1 below. These toners facilitate high quality transfers of toned images to image receptors at low temperatures. Multi-copy transfer can occur at room temperature which simplifies the process and eliminates heat distortions. Greater resolution is obtained. These non-electroscopic, prolonged tack toners comprise an organic, thermoplastic terpolymer, a solid plasticizer and, optionally, a colorant. The terpolymer consists of substantially equal percentages by weight of styrene, alpha-methyl styrene and an acid selected from the group consisting of acrylic acid and methacrylic acid which can be made using conventional techniques such as solution polymerization. The preferred acid is acrylic acid. The terpolymer has a molecular weight average in the range from 1,000 to 20,000, preferably 1,500 to 10,000 and, most preferably, 2,000 to 8,000. It is present in an amount from 10% by weight to 70% by weight based on total toner weight and, more preferably, 20% to 50%. As the solid plasticizer, there can be mentioned triphenyl phosphate, diphenyl phthalate, dicyclohexyl phthalate, and N-cyclohexyl-p-toluenesulfonamide. The preferred plasticizer is triphenyl phosphate. Plasticizer can be present in an amount from 30% to 90% by weight based on total toner weight. The preferred range is 50% to 70% based on total toner weight.

Optionally, colorants can be used, as was mentioned above. Those which are suitable to practice the invention include a dye or pigment such as carbon black which can be combined with the terpolymer and plasticizer. There are a number of dyes and pigments which are known to those skilled in the art which can be used. The colorant is present in an amount from 0% to 50% based on total toner weight and, more preferably, from 0.5% to 20%.

The toner particles have a size distribution within the range of 0.2 to 30 micrometers and not more than 50% of the toner particles being less than 1 micrometer particle size as described in U.S. Pat. No. 3,620,726.

Among suitable photopolymerizable or photohardenable compositions are: (1) those in which a photopolymerizable monomer is present alone or in combination with a compatible binder, or (2) those in which the photopolymerizable groups are attached to a polymer backbone which becomes activated to light and can then crosslink by reacting with a similar group or other reactive sites on adjacent polymer chains. In the second group of suitable photopolymerizable systems, where the monomer or pendant photopolymerizable group is capable of addition polymerization, e.g., a vinyl monomer, the photopolymerized chain length can involve addition of many similar units initiated by a single photochemical event. Where only dimerization of similar compounds is involved, e.g., benzophenone or cinnamoyl compounds, the average molecular weight of the photosensitive constituent can be at best only doubled by a single photochemical act. Where a photopolymerizable molecule has more than one reactive site, a crosslinked network can be produced.

If either a simple monomer or monomer-polymer binder composition is being used, the photosensitive layer preferably contains a free radical generating, addition polymerization initiator. Plasticizing agents, as well as other known additives, can be present in the photosensitive layer.

Suitable free radical initiated, chain propagating, additional polymerizable layers are described in U.S. Pat. Nos. 3,060,023, 3,261,686 and 3,380,831. Polymers for use in the monomer-polymer binder system and preferred free radical generating addition polymerization initiators are described in U.S. Pat. No. 3,060,023.

Photodimerizable materials useful in the invention are cinnamic acid esters of high molecular weight polyols, polymers having chalcone and benzophenone type groups, and other disclosed in Chapter 4 of "Light-Sensitive Systems" by Jaromir Kosar published by John Wiley & Sons, Inc., New York, 1965. Photopolymerizable materials capable of photocrosslinking with more than one adjacent polymeric chain to form a network are described in U. S. Pat. Nos. 3,418,295 and 3,469,982.

Preferred free radical generating addition polymerization initiators, activatable by actinic radiation, e.g., ultraviolet and visible radiation, are listed in U.S. Pat. No. 3,060,023 and the other patents referred to above.

Suitable plasticizers include dialkyl phthalate, polyoxyethylene(4)monolaurylether, polyethylene glycol, triethylene glycol diacetate, alkyl phosphates, etc.

The photosensitive layer, 0.0003 to 0.004 inch (0.0076 to 0.10 mm) thick, can be present on a surface such as a polymer film, plastic, metal or sheet such as paper whereon it adheres. The photosensitive composition can be either laminated or coated on the surface under conditions known to those skilled in the art. A known protective film such as is described in U.S. Pat. No. 3,060,026 can be present on the photosensitive layer. The protective film, e.g., polyethylene terephthalate, polyethylene, etc., can be present during imagewise exposure but is removed prior to application of the non-electroscopic, prolonged tack toner to the tacky imaged surface.

The photopolymerizable layer is exposed to actinic radiation, generally through a process transparency, e.g., a process negative or positive (an image-bearing transparency consisting solely of substantially opaque and substantially transparent areas where the opaque areas are substantially of the same optical density).

Since photosensitive compositions of this invention generally exhibit their maximum sensitivity in the ultraviolet range, the radiation source should furnish an effective amount of this radiation. Such sources include carbon arcs, mercury-vapor arcs, fluorescent lamps with special ultraviolet-emitting phosphors, argon glow lamps, electronic flash units and photographic flood lamps. The amount of exposure required for satisfactory reproduction of a given photosensitive layer is a function of intensity, type of radiation source used, and distance between the radiation source and layer surface. In general, exposure times range from 10 seconds to 10 minutes or more using standard commercial radiation sources.

Subsequent to the formation of the latent image, and removal of any cover sheet, if present, the tacky image areas are toned with particles of a non-electroscopic, prolonged tack toner of the type described above. The toner particles adhere primarily in the tacky image areas. Any toner particles which should remain in the nontacky background areas can be removed by means known in the art, e.g., wiping, air devices, etc. The prolonged tack toner particles are then activated by heating the toner particles to at least a temperature wherein the toner particles become tacky.

The activated tacky toned image-bearing substrate is brought into intimate contact, for example, under pressure, at a low temperature in the range from 20° C. to 70° C. with an image receptor. Image receptors which are suitable for practicing the invention include paper, uncoated or coated such as Kromekote ®, film such as polyethylene terephthalate, metals such as aluminum, copper clad fiberglass epoxy or phenolic resin board, etc.

Heretofore, it has been quite difficult to transfer an image from an element to an image receptor using conventional toners such as those described above. As is shown in the examples and comparative examples below, the toners described herein make it possible to transfer images to image receptors at low temperatures.

Upon separation of the element and the image receptor, the toner fails cohesively and a portion thereof transfers imagewise to the image receptor. After reducing or permitting the temperature of the prolonged tack toner particles to be reduced below their activating temperature, wherein the prolonged tack toner particles remain tacky for a period of time, the process can be repeated using a new image receptor to receive each additional transferred image.

In practicing the invention, all that is necessary is an image capable of accepting a prolonged tack toner of the type disclosed below and some method for applying toner thereon. Toning devices such as those disclosed in U.S. Pat. No. 4,109,821 can be used. A typical toner applicator is shown in FIG. 1 of U.S. Pat. No. 3,260,612; an applicator of the type disclosed in U.S. Pat. No. 3,013,878 can be employed. Applicators as shown in U.S. Pat. Nos. 3,965,478 and 3,670,701 can also be used.

The automatic toning apparatus described in U.S. Pat. No. 4,069,791 and the toning and transfer apparatus described in U.S. Pat. No. 4,461,823, the disclosures of which are hereby incorporated by reference, can be used to practice the invention.

Prolonged tack toned images of the types described above can be used in single or multiple transfers to an image receptor using the same or different toners. The transferred image can also be toned subsequently with additional prolonged tack toner to generate a higher density transferred image. Multicolored images can be prepared on at least one image receptor by preparing a desired number of photosensitive elements, e.g., at least two and, preferably, four, exposing each element through a different color separation transparency and toning each imagewise tacky element with the appropriately colored prolonged tack toner. Each toned image is then transferred in register to the same image receptor.

The invention is useful for the preparation of toned images of high optical density wherein a tackified toned image on an element is retoned with additional toner a number of times, so as to build the image density on the surface of the element to any desired point.

Furthermore, high optical densities can be obtained on different image receptors by reheating the toned image left behind on the element after the initial transfer, followed by partially transferring this reheated toned image to a different image receptor, reducing the temperature of transferred toned image below the activating temperature of the prolonged tack toner wherein the toner remains tacky and retoning the transferred toned image with additional dry particulate prolonged tack toner.

Resist images can be formed by transferring the toned image to copper clad laminates, e.g., phenolic resin or fiberglass epoxy boards, for example, and subsequently etching or plating the boards in the conventional manner.

Lithographic printing plates can also be prepared by transferring the toned image to a lithographic surface, e.g., an aluminum plate, at a temperature in the range from 20° C. to 70° C. The transferred image is then treated and inked to produce inked impressions of the image. It is preferred that after transfer of the image, the image is heated up to about 150° C. and more preferably following treatment with triethanolamine titanate chelate or other crosslinking agents. Still better results are achieved when, after transfer while the image is still tacky and prior to heating, the toned image is retoned with a different toner containing polymer particles, e.g., polystyrene beads, pigmented polymers with maximum average diameter of about 50 microns, etc.

EXAMPLES

This invention is illustrated by the following examples wherein the percentages are by weight.

Unless otherwise specified, all toners were evaluated according to the procedure described in Example 1.

EXAMPLE 1

A cyan toner was prepared according to the following procedure:

26.4 grams (6.6%) of Heliogen® Blue K 7090 (BASF Corp., Holland, Mich. 49423), 244.4 grams (61.1%) of triphenyl phosphate (Monsanto Company, St. Louis, Mo. 3167) and 129.2 grams (32.3%) of a terpolymer which was approximately equal in weight of styrene, alpha-methylstyrene and acrylic acid and having a weight average molecular weight of ca. 2500 were placed in a 2 quart Bain Marie container (Le Beau Products, Baraboo, Wis. 53913). A 6 inch (15.24 cm) stainless steel chain was added and the mixture shaken on a Paint Conditioner, Model MKI-R (Red Devil, Inc., Union, N.J. 07083) for 30 minutes.

This mixture was slowly added to a 2 roll rubber mill at 50°–55° C. so that a continuous molten band formed. The mill had 6 inch (15.24 cm) diameter rolls, 12 inches (30.48 cms) wide (William Thropp & Sons, Salem, Ohio 44460). The mixture was cut by a doctor blade and returned repeatedly to the mill to reband for 20 minutes. The dispersion was then left on the rotating rolls for another 20 minutes. After removal from the rolls, it was cooled and broken up into 1—3 inch (2.54–7.62 cm) chips which were sufficiently small to be fed to a hammer mill.

The chips were fed to a Reitz mill to produce a course powder. This was fed to an 8 inch (20.32 cm) jet mill (Jet Pulverizer Co., Palmyra, N.J.) at 50 grams per minute. Particle size was obtained on a Coulter Counter Model TAII (Coulter Electronics, Inc., Hialeah, Fla. 33010) with a 30 micron aperture. Population average was 1.6 microns. Volume average was 13.0 microns.

The 2 roll mill temperature should be followed fairly closely. If the temperature rises much above 55° C. the melt will become too fluid and drip from the mill. If much below 50° C. the mass will not melt and dispersion will not take place.

A photopolymerizable element similar to that described in U.S. Pat. No. 4,461,823 was placed in a vacuum frame, with the cover sheet facing the glass cover of the vacuum frame. A transparency bearing a positive halftone image of the subject to be reproduced was then placed over the cover sheet, and the vacuum frame glass cover closed. Vacuum of about 25 inches of water (approx. 635 kg/m$^2$) was applied to assure intimate contact of the transparency and the element. Using a 5 KW mercury vapor light source at a distance of 58 inches (147.3 cms), the photopolymer element was given a 35 second exposure. As a result of the exposure to actinic radiation the photopolymerizable layer surface exhibited imagewise tacky (unexposed) and non-tacky (exposed) areas.

The element was then removed from the vacuum frame and the cover sheet was peeled off. The exposed element was then toned by hand using an acrylic pad material attached to a plastic handle, whereby the toner prepared as described above was applied over the exposed photopolymerizable surface. Toner particles adhered to the tacky areas and the remaining toner was wiped off the element by a special cloth (Las-Stik® manufactured by Las-Stik Manufacturing Co., Hamilton, Ohio). The toned element was then subjected to heating to 135° F. (57.2° C.) for about 1 minute on a heating platen. The image was then transferred to a Kromekote® receptor manufactured by the Champion Paper Co. at a transfer speed of 3.5 ft/min (0.5 cm/sec) in a modified Cromalin® laminator manufactured by Du Pont equipped with a metal heated roll at 50° C. and an unheated roll.

The transferred toner image had good quality with a resolution of 2–97% dots in a 150 lines per inch target. The density was uniform at about 1.30 as measured on a Macbeth reflection densitometer.

EXAMPLE 2

Example 1 was repeated except that the toners were chilled for ca. 16 hours in the freezer compartment of a refrigerator at approximately −20° C. before jet milling to minimize accumulation of product in the interior of the jet mill.

The toner image, which was transferred at 50° C., had good quality.

COMPARATIVE EXAMPLE 1

6.6% of Du Pont BT-383-D, a copper phthalocyanine pigment, 61.1% of triphenyl phosphate (Monsanto Company, St. Louis, Mo. 63167) and 32.3% of a copolymer of methyl methacrylate/acrylic acid (90/10), molecular weight average of 20,000, were used to prepare a cyan toner according to the procedure described in Example 2. Particle size was obtained on a Coulter Counter Model TAII (Coulter Electronics, Inc., Hialeah, Fla. 33010) with a 50 micron aperture. Population average was 1.8 microns. Volume average was 4.3 microns.

The toner image, which was transferred at 50° C., showed very poor, incomplete transfer. Thus, it was not possible to obtain any reading on a reflection densitometer.

EXAMPLE 3

A cyan toner was prepared and tested by the procedure described in Example 1 with the following exceptions: 280.0 grams (70.0%) of triphenyl phosphate and 93.6 grams (23.4%) of the terpolymer described in Example 1 were used. Particle size was determined as described in Example 1. Population average was 1.4 microns and volume average was 14.0 microns.

The toner image which was transferred at 50° C. had good quality.

EXAMPLE 4

200.0 grams (50.0%) of triphenyl 1 phosphate and 93.6 grams (43.4%) of the terpolymer described in Example 1 were used to prepare a cyan toner according to the procedure described in Example 2. Particle size was determined as described in Example 1. Population average was 1.9 microns and volume average was 9.0 microns.

The toner image which was transferred at 50° C. had good quality.

EXAMPLE 5

22.2 grams Quindo ® Magenta RV-6803 (Mobay Corp., Haledon, N.J. 07508), 4.2 grams Indofast Brilliant Scarlet R-6300 (Mobay Corp.), 200.0 grams triphenyl phosphate and 173.6 grams terpolymer from Example 1 were used to prepare a magenta toner according to the procedure described in Example 1.

Particle size determined on a Coulter Counter using a 30 micron aperture was:
1.6 microns population
3.0 microns volume The toner image, which was transferred at 50° C., had good quality.

EXAMPLE 6

31.2 grams Sterling NS (Cabot Corp., Waltham, Mass. 02254), 240 grams triphenyl phosphate, 128.8 grams terpolymer from Example 1 were used to prepare a black toner according to the procedure described in Example 1.

Mean particle size measured on a Microtrac ® Particle Analyzer (Leeds and Northrup Instruments, North Wales, Pa. 19450) was 2.3 microns. The toner image which was transferred at 50° C. had good quality.

EXAMPLE 7

28.0 grams Dalamar ® Yellow, YT-858-D (Heubach, Inc., Newark, N.J. 07114), 240 grams triphenyl phosphate, 132 grams terpolymer from Example 1 were used to prepare a yellow toner according to the procedure described in Example 1.

Microtrac ® mean particle size was 3.0 microns as was determined using a Microtrac ® Particle Analyzer. The toner image which was transferred at 50° C. had good quality.

EXAMPLE 8

Example 1 was repeated except that the toner image was transferred to an aluminum plate suitable for the preparation of a lithographic printing plate having a silicate coated surface. The photopolymer toned element was brought into intimate contact with the aluminum plate under high pressure in a nip formed by two rollers at 50° C. A uniform looking image was transferred onto the aluminum plate. The transferred image was subsequently heated to 150° C. for five minutes. A gum arabic scrubbing and cleanser solution was wiped on the transferred image. The transferred image was then used as a lithographic printing plate to produce 12,500 inked impressions.

EXAMPLE 9

The toners and transfer process described above were used to make a four color proof. First, the cyan image was produced on Kromekote ® paper as described in Example 1 using the toner of Example 1. Second, the magenta image was generated as described in Example 5 using the toner of Example 5, except that the transfer was made on top of the cyan image in register using standard pin registration for the exposure and transfer steps. Third, the yellow image produced as described above using the yellow toner of Example 7 which was transferred, in register, on top of the magenta image. Finally, the black image was transferred, in register, on top of the yellow image using the toner of Example 6. After each transfer the transferred image was detackified by toning with a colorless powder consisting of a clear, unpigmented cellulose acetate toner having a 2.5 micron mean particle size in order to prevent any back transfer of the tacky image. This untreated cellulose acetate toner is similar to that described in U.S. Pat. No. 4,869,996 which issued on Sept. 26, 1989. Thus, a high quality four color proof was generated.

What is claimed is:

1. A non-electroscopic prolonged tack toner comprising:
   (i) an organic, thermoplastic terpolymer consisting of substantially equal percentages by weight of styrene, alpha-methyl styrene and an acid selected from the group consisting of acrylic acid and methacrylic acid, said terpolymer having an average molecular weight in the range from 1,000 to 20,000 said terpolymer being present in an amount of 10% to 70% by weight based on the total toner weight;

(ii) a solid plasticizer which is present in an amount from 30% to 90% by weight based on the total toner weight; wherein said toner is suitable for transferring toned images at low temperatures to an image receptor.

2. A toner according to claim 1 wherein the acid is acrylic acid.

3. A toner according to claim 1 wherein the plasticizer is triphenyl phosphate.

4. A toner according to claim 1 wherein a colorant is present in an amount ranging from 0.5% to 50%.

5. A process for forming an image from an element having a latent image, said image having toner receptive and background areas which comprises:
(a) applying to the latent image of the element a prolonged tack toner according to claim 1 to produce a nontacky toned image;
(b) heating the toned image to a temperature sufficient to activate the toner by rendering the toner tacky;
(c) bringing the tacky toned element into intimate contact with an image receptor, and, while the toner is still activated, and
(d) separating the element and image receptor whereby a portion of the activated prolonged tack toner transfers imagewise to the receptor.

6. A process according to claim 5 wherein the following is performed after step (d):
(e) reducing the temperature of the tackified toned image below the activating temperature of the prolonged tack toner wherein the toner remains tacky,
(f) applying dry particulate prolonged tack toner over the remaining tacky toner on the element, and
(g) repeating steps (b) through (d) at least one time using a separate image receptor in step (c).

7. A process according to claim 5 or 6 wherein the toned image is transferred at a temperature in the range from 20° C. to 70° C.

8. A process according to claim 5 or 6 wherein the image receptor is an aluminum plate and after image transfer the image is heated at a temperature up to 150° C., treated with lithographic solutions and used as a lithographic printing plate.

9. A process according to claim 8 wherein the toned image is transferred at a temperature in the range from 20° C. to 70° C.

10. A process for forming an image from an element having a latent image, said image having toner receptive and background areas which comprises:
(a) applying to the latent image of the element a prolonged tack toner according to claim 1 to produce a nontacky toned image;
(b) heating the toned image to a temperature sufficient to activate the toner by rendering the toner tacky;
(c) bringing the tacky toned element into intimate contact with an image receptor, and, while the toner is still activated,
(d) separating the element and image receptor whereby a portion of the activated prolonged tack toner transfers imagewise to the receptor;
(e) reducing the temperature of the tackified toned image on the image receptor below the activating temperature of the prolonged tack toner wherein the toner remains tacky; and
(f) applying dry particulate prolonged tack toner over the still tacky image on the image receptor to increase the density of the toned transferred image.

11. A process according to claim 10 wherein after step (f) the following steps are performed:
(g) heating the toned image formed on the image receptor;
(h) reducing the temperature of the tackified toned image below the activating temperature of the prolonged tack toner wherein the toner remains tacky; and
(i) applying dry particulate prolonged tack toner over the still tacky image on the image receptor to increase the density of the toned transferred image.

12. A process according to claim 10 wherein after step (f), steps (b) through (f) are repeated at least once using a different image receptor in step (c).

13. A process according to claim 10, 11 or 12 wherein the toned image is transferred at a temperature in the range from 20° C. to 70° C.

14. A process for forming an image from an element having a latent image having toner receptive and background areas which comprises:
(a) applying to the latent image of the element a prolonged tack toner according to claim 1 to produce a nontacky toned image;
(b) heating the toned image to a temperature sufficient to activate the toner by rendering the toner tacky;
(c) bringing the tacky toned element into intimate contact with an image receptor, and while the toner is still activated; and
(d) separating the element and image receptor whereby a portion of the activated prolonged tack toner transfers imagewise to the image receptor,
steps (a) to (d) being repeated at least two times using different elements having tacky toner receptive areas and nontacky background areas formed therein by exposure with actinic radiation through different color separation transparencies and the transfer step is accomplished by transferring in register toners of appropriate color with respect to the separation transparencies onto a single image receptor.

15. A process according to claim 14 wherein the following steps are performed after step (d):
(e) reducing the temperature of the tackified toned image on the element below the activating temperature of the prolonged tack toner wherein the toner remains tacky,
(f) applying dry particulate prolonged tack toner over the remaining tacky toner on the element, and
(g) repeating steps (b) through (d) at least one time using a separate image receptor in step (c).

16. A process according to claim 15 wherein steps (b) to (g) are repeated four times.

17. A process according to claim 12 wherein the image receptor is paper.

18. A process according to claim 12 wherein the image receptor is coated paper.

19. A process according to claim 14 wherein the toned image is transferred at a temperature in the range from 20° C. to 70° C.

20. A process according to claim 14 wherein steps (a) to (d) are repeated four times.

* * * * *